United States Patent
Dodson et al.

(10) Patent No.: US 10,847,071 B2
(45) Date of Patent: Nov. 24, 2020

(54) ELECTRONIC DEVICES HAVING AMBIENT LIGHT SENSORS WITH LENS DIFFUSERS

(71) Applicant: Apple Inc., Cupertino, CA (US)

(72) Inventors: Christopher M. Dodson, Santa Clara, CA (US); Prashanth S. Holenarsipur, Fremont, CA (US); Serhan O. Isikman, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 88 days.

(21) Appl. No.: 15/967,367

(22) Filed: Apr. 30, 2018

(65) Prior Publication Data
US 2019/0333431 A1    Oct. 31, 2019

(51) Int. Cl.
*G09G 3/20*      (2006.01)
*G02B 5/02*      (2006.01)
*H01L 31/0232*   (2014.01)
*G02B 1/04*      (2006.01)
*H01L 31/16*     (2006.01)
*G02B 3/00*      (2006.01)

(52) U.S. Cl.
CPC .............. *G09G 3/20* (2013.01); *G02B 1/041* (2013.01); *G02B 3/0043* (2013.01); *G02B 3/0056* (2013.01); *G02B 5/0278* (2013.01); *H01L 31/02327* (2013.01); *H01L 31/16* (2013.01); *G02B 2003/0093* (2013.01); *G09G 2320/0626* (2013.01); *G09G 2320/0666* (2013.01); *G09G 2320/08* (2013.01); *G09G 2360/144* (2013.01)

(58) Field of Classification Search
CPC .............. G09G 3/20; G09G 2320/0626; G09G 2320/0666; G09G 2320/08; G09G 2360/144; G02B 1/041; G02B 3/0043; G02B 3/0056; G02B 5/0278; G02B 2003/0093; H01L 31/02327; H01L 31/16
See application file for complete search history.

(56) References Cited

U.S. PATENT DOCUMENTS

| | | |
|---|---|---|
| 8,749,538 B2 | 6/2014 | Webster et al. |
| 8,970,571 B1 | 3/2015 | Wong et al. |
| 9,881,943 B2 | 1/2018 | Evans et al. |
| 2002/0045028 A1* | 4/2002 | Teshima ............... B32B 3/08 428/156 |
| 2004/0126064 A1* | 7/2004 | Vandentop ............ G02B 3/005 385/49 |

(Continued)

*Primary Examiner* — Stephen G Sherman
(74) *Attorney, Agent, or Firm* — Treyz Law Group, P.C.; G. Victor Treyz; Matthew R. Williams

(57) ABSTRACT

An electronic device may be provided with a display mounted in a housing. The display may have an array of pixels configured to display images. A display cover layer may overlap the array of pixels. A light sensor such as a color ambient light sensor may be mounted in the electronic device and may receive ambient light through an ambient light sensor window region in the display cover layer or other portion of the electronic device. A diffuser may be located between the display cover layer and the ambient light sensor. The diffuser may have a substrate such as a glass substrate. A lens layer may be supported by the substrate. The lens layer may be formed from a layer of ultraviolet-light-curable polymer in which an array of lenses has been formed. An infrared-light-blocking-and-visible-light-transmitting filter may be used to reduce infrared light reaching the ambient light sensor.

20 Claims, 9 Drawing Sheets

(56) References Cited

U.S. PATENT DOCUMENTS

| | | | | |
|---|---|---|---|---|
| 2006/0290253 A1* | 12/2006 | Yeo | ................... | G02B 5/0226 |
| | | | | 313/116 |
| 2008/0002256 A1* | 1/2008 | Sasagawa | ............ | G02B 5/0226 |
| | | | | 359/487.03 |
| 2015/0102212 A1* | 4/2015 | Ruh | ................... | G01J 1/0474 |
| | | | | 250/237 R |
| 2015/0378240 A1* | 12/2015 | Wang | ..................... | G02F 1/29 |
| | | | | 349/33 |
| 2016/0116653 A1* | 4/2016 | Murayama | ........ | H01L 27/14618 |
| | | | | 359/359 |
| 2016/0232828 A1* | 8/2016 | Jia | ..................... | G09G 3/2003 |
| 2017/0299810 A1* | 10/2017 | Brouwer | .......... | B29D 11/00692 |
| 2017/0312950 A1* | 11/2017 | Wolterink | ........ | B29D 11/00009 |
| 2018/0284326 A1* | 10/2018 | Arima | ................... | G03B 21/14 |

\* cited by examiner

ELECTRONIC DEVICES HAVING AMBIENT LIGHT SENSORS WITH LENS DIFFUSERS

FIELD

This relates generally to electronic devices, and, more particularly, to light sensors for electronic devices.

BACKGROUND

Electronic devices such as laptop computers, cellular telephones, and other equipment are sometimes provided with light sensors. For example, ambient light sensors may be incorporated into a device to provide the device with information on current lighting conditions. Ambient light readings may be used in controlling the device. If, for example, bright daylight conditions are detected, an electronic device may increase display brightness to compensate. In some configurations, color ambient light sensors are used to gather information on the color of ambient light. Adjustments to the color cast of a display can be made based on the color of the ambient light.

To help reduce the impact of directional light sources on ambient light sensor readings, ambient light sensors may be provided with light diffuser layers that include light-scattering particles. Challenges can arise, however, in forming light diffuser layers. If care is not taken, a light diffuser layer for an ambient light sensor may have undesired light transmission characteristics.

SUMMARY

An electronic device may be provided with a display mounted in a housing. The display may have an array of pixels configured to display images. A display cover layer may overlap the array of pixels. A light sensor such as a color ambient light sensor may be mounted in the device and may receive ambient light through an ambient light sensor window region in the display cover layer or other portion of the electronic device.

A light diffuser may be used to diffuse ambient light before the ambient light is measured by the ambient light sensor. The diffuser may be located between the display cover layer and the ambient light sensor. The diffuser may have a substrate such as a glass substrate. A lens layer may be supported by the substrate. The lens layer may be formed from a layer of ultraviolet-light-curable polymer in which an array of lenses has been formed. A polymer buffer layer that is formed from a different polymer material than the lens layer may be interposed between the lens layer and the substrate layer to help prevent delamination of the lens layer. An optional diffuser layer for the diffuser may be formed from the polymer buffer layer by incorporating light-scattering particles into the polymer buffer layer. Light-scattering particles such as these may also be incorporated into the lens layer. Concave and convex lenses in regular and irregular patterns may be formed in the lens layer on first and/or second opposing sides of the diffuser.

Infrared light in the ambient light measured by the ambient light sensor may be reduced by incorporating an infrared-light-blocking-and-visible-light-transmitting filter structure between the display cover layer and the ambient light sensor. The filter structure may be formed as a coating on the ambient light sensor, as a stand-alone filter layer interposed between the diffuser and the ambient light sensor, or as part of the diffuser (as examples). In an illustrative arrangement, the diffuser may have a glass substrate formed from blue glass to absorb infrared light and transmits visible light.

DETAILED DESCRIPTION

Figure 1:
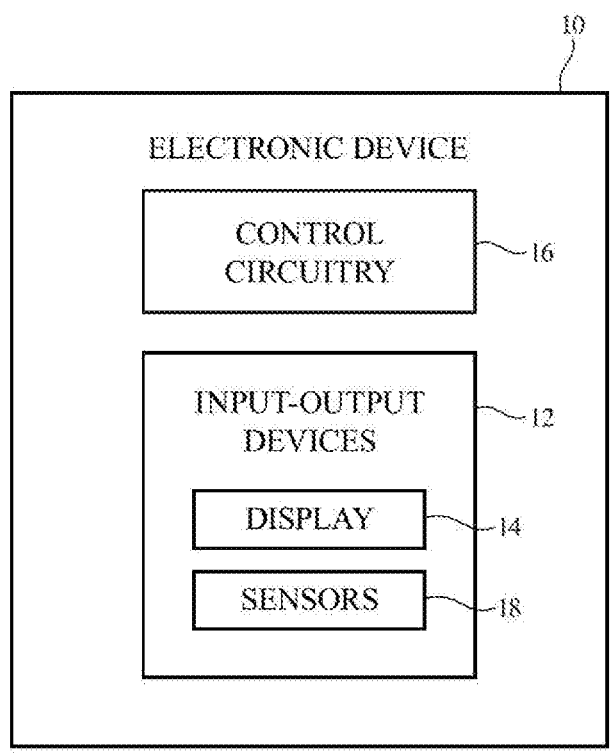
FIG. 1 is a schematic diagram of an illustrative electronic device having an ambient light sensor in accordance with an embodiment.

An illustrative electronic device of the type that may be provided with one or more light sensors is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Input-output devices 12 may also include sensors 18. Sensors 18 may include an ambient light sensor and other sensors (e.g., a capacitive proximity sensor, a light-based proximity sensor, a magnetic sensor, an accelerometer, a force sensor, a touch sensor, a temperature sensor, a pressure sensor, a compass, a microphone or other sound sensor, or other sensors).

An ambient light sensor for device 10 may have a single light detector (e.g., the ambient light sensor may be a monochromatic ambient light sensor that measures ambient light intensity) or may have an array of detectors each of which is provided with a different respective color filter. Information from the detectors may be used to measure the total amount of ambient light that is present in the vicinity of device 10 (ambient light intensity). For example, the ambient light sensor may be used to determine whether device 10 is in a dark or bright environment. Based on this information, control circuitry 16 can adjust display brightness for display 14 or can take other suitable action. The array of colored detectors may also be used to make color measurements (i.e., the ambient light sensor may be a color sensing ambient light sensor). Color measurements may be gathered as color coordinates, color temperature, or correlated color temperature (as examples). Processing circuitry may be used to convert these different types of color information to other formats, if desired (e.g., a set of color coordinates may be processed to produce an associated correlated color temperature, etc.).

Color and brightness information from a color sensing ambient light sensor can be used to adjust the operation of device 10. For example, the color cast of display 14 may be adjusted in accordance with the color of ambient lighting conditions. If, for example, a user moves device 10 from a cool lighting environment to a warm lighting environment (e.g., an incandescent light environment), the warmth of display 14 may be increased accordingly, so that the user of device 10 does not perceive display 14 as being overly cold. In general, any suitable actions may be taken based on color measurements and/or total light intensity measurements (e.g., adjusting display brightness, adjusting display content, changing audio and/or video settings, adjusting sensor measurements from other sensors, adjusting which on-screen options are presented to a user of device 10, adjusting wireless circuitry settings, etc.).

Figure 2:
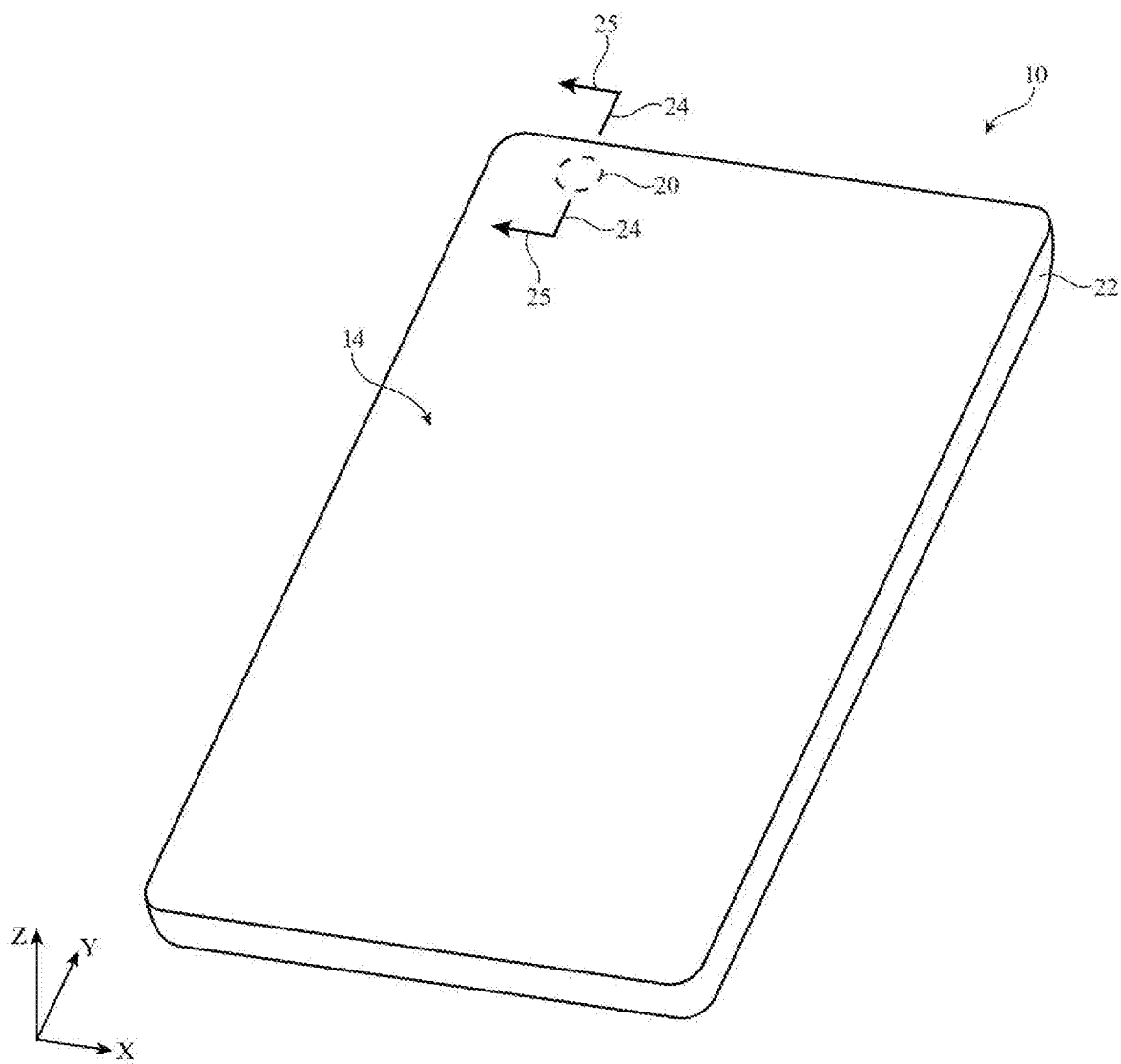
FIG. 2 is a perspective view of a portion of an electronic device with an ambient light sensor in accordance with an embodiment.

A perspective view of a portion of an illustrative electronic device is shown in FIG. 2. In the example of FIG. 2, device 10 includes a display such as display 14 mounted in housing 22. Housing 22, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 22 may be formed using a unibody configuration in which some or all of housing 22 is machined or molded as a single structure or may be formed using multiple structures (e.g., an internal frame structure, one or more structures that form exterior housing surfaces, etc.).

Display 14 may be protected using a display cover layer such as a layer of transparent glass, clear plastic, a crystalline material such as sapphire, or other clear layer. Openings may be formed in the display cover layer. For example, an opening may be formed in the display cover layer to accommodate a button, a speaker port, or other components. Openings may be formed in housing 22 to form communications ports (e.g., an audio jack port, a digital data port, etc.), to form openings for buttons, etc.

Display 14 may include an array of display pixels formed from liquid crystal display (LCD) components, an array of electrophoretic pixels, an array of plasma pixels, an array of organic light-emitting diode pixels or other light-emitting diodes, an array of electrowetting pixels, or pixels based on other display technologies. The array of pixels forms an active area for displaying images on display 14. One or more border regions of the display may be free of pixels and may form an inactive display area. To hide inactive circuitry and other components in the inactive area from view by a user of device 10, the underside of the outermost layer of display 14 (e.g., the display cover layer or other display layer) may be coated with an opaque masking material such as a layer of black ink. Optical components (e.g., a camera, a light-based proximity sensor, an ambient light sensor, status indicator light-emitting diodes, camera flash light-emitting diodes, etc.) may be mounted under the inactive border area. One or more openings (sometimes referred to as windows) may be formed in the opaque masking layer of the inactive area to accommodate the optical components. For example, a light component window such as an ambient light sensor window may be formed in a region such as region 20 that lies in a peripheral portion of display 14 (e.g., an inactive border area). Ambient light from the exterior of device 10 may be measured by an ambient light sensor in the interior of device 10 that is aligned with region 20 (e.g., after the ambient light has passed through the ambient light sensor window of region 20).

Figure 3:
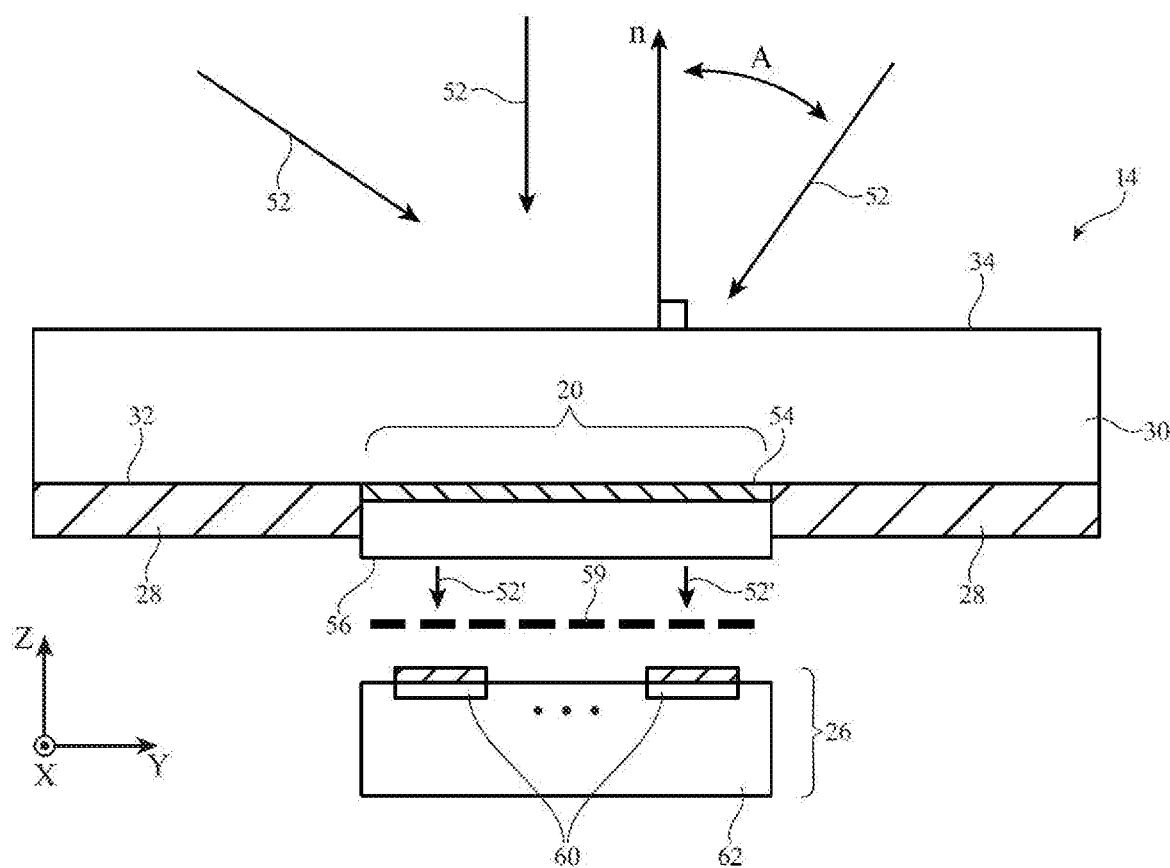
FIG. 3 is a cross-sectional side view of an illustrative light sensor in accordance with an embodiment.

FIG. 3 is a cross-sectional side view of display 14 of FIG. 2 taken along line 24 and viewed in direction 25 of FIG. 2. As shown in FIG. 3, light sensor 26 may be mounted in alignment with window region (window) 20. Region 20 may have a circular shape, a square shape, a shape with curved and/or straight edges, a circular ring shape with a central opaque region, or any other suitable shape. Light sensor 26 may be a monochromatic ambient light sensor or a color sensing ambient light sensor that is used in measuring ambient light in the vicinity of device 10.

As shown in FIG. 3, display 14 may have an outermost layer such as display cover layer 30. Display cover layer 30 has an outer surface such as surface 34. Surface normal n is perpendicular to surface 34. Rays of ambient light 52 are characterized by various angles of incidence A measured with respect to surface normal n.

Window region 20 may be formed from an opening in opaque masking layer 28 on inner surface 32 of display cover layer 30. Layer 30 may be formed from glass, plastic, ceramic, sapphire, or other transparent materials and may be a part of a display module for display 14 or may be a separate protective layer that covers active display structures. The opening associated with window 20 may be filled with optical structures such as ambient light sensor ink 54.

Ambient light sensor ink 54 may have sufficient transparency at visible and infrared wavelengths to allow sensor 26 to operate, while at the same time enhancing the outward appearance of window 20 (e.g., by partly obscuring the presence of window 20 to a user of device 10 by making window 20 have a visual appearance that is not too dissimilar from the portion of layer 30 that includes layer 28). If desired, ambient light sensor ink 54 may be omitted. Windows for sensor 26 may also be formed in other portions of device 10 (e.g., in housing walls, etc.). The example of FIG. 3 is illustrative.

Sensor 26 may have light detectors 60 (e.g., photodiodes, phototransistors, or other semiconductor photodetector structures). Light detectors 60 may be formed in an array on a common semiconductor substrate such as substrate 62 or may be formed using two or more substrates. Each of light detectors 60 may be provided with a corresponding color filter 58. To provide sensor 26 with the ability to accurately measure colors, sensor 26 may include two or more detectors 60 (e.g., 2-10 detectors, 3-8 detectors, 4-7 detectors, 5-7 detectors, only 4 detectors or more than 4 detectors, only 5 detectors or more than 5 detectors, only 6 detectors or more than 6 detectors, only 7 detectors or more than 7 detectors, only 8 detectors or more than 8 detectors, fewer than 8 detectors, or any other suitable number of detectors). Filters 58 may be thin-film interference filters and/or may be colored layers of polymer or other color filter elements (e.g., colored filters formed from dyes and/or pigments in polymer binder). If desired, an infrared-light-blocking filter such as filter 59 (sometimes referred to as an IR cut filter) can be included in device 10. Filter 59 can be incorporated into filters 58, may overlap filters 58, may be implemented as a separate filter formed using a separate substrate, may be formed from a filter coating covering or formed within the material(s) forming filters 58, or may be formed as part of a diffuser.

Diffuser 56 may be used to gather light 52 from a variety of angles of incidence A and to effectively pass this light to sensor 26 as diffused (collimated) light 52'. Diffuser 56 may include structures such as an array of small lenses to help redirect off-axis ambient light rays into sensor 26 at an angle that is close to perpendicular to the surface of substrate 62, thereby reducing the dependence of ambient light readings on the relative orientation between device 10 and the sources of ambient light, enhancing sensor efficiency, and helping to reduce measurement errors that might arise if different rays of ambient light 52 with different incident angles A pass through different amounts of ink 54 and other materials before being measured.

Figure 4:
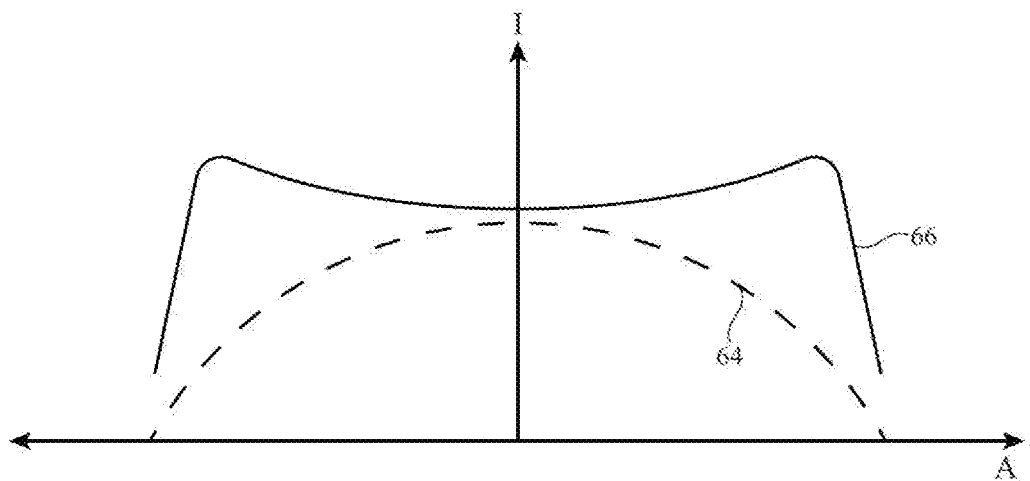
FIG. 4 is a graph comparing light diffusing performance between different light diffusers in accordance with an embodiment.

FIG. 4 compares the operations of two different illustrative diffusers.

In a first illustrative arrangement, diffuser 56 is formed from a layer or layers of diffusing material such as a transparent polymer layer with embedded light-scattering particles. The particles and the polymer layer may have different refractive indices so that light is scattered as the light passes through the polymer layer and strikes the light-scattering particles. The light-scattering particles may be, for example, particles of titanium oxide or other inorganic materials with relatively high refractive index values. Configurations in which a diffuser is formed form gas bubbles entrapped in a polymer layer may also be used. This first illustrative diffuser type may scatter incoming ambient light rays 52 of angular orientation A with respect to surface normal n into outgoing rays detected by light sensor 26 (rays 52' of FIG. 3) of intensity I in accordance with first light scattering curve 64. Curves such as curve 64 are sometimes said to correspond to a Lambertian (cosine function) light scattering profile.

As illustrated by the reduced values of intensity I at larger angles A with curve 64, this first type of diffuser may not capture off-axis ambient light 52 as efficiently as on-axis light (ambient light 52 with an angle of incidence value A near to 0°).

Enhanced diffusion efficiency for off-axis light (larger angles A) can be achieved by using a second illustrative arrangement for diffuser 56. In this second illustrative arrangement, diffuser 56 includes an array of lenses (sometimes referred to as microlenses). The lenses can direct (e.g., collimate) more off-axis light to sensor 26 as rays 52' and can therefore exhibit larger values of captured light intensity I at larger values of incident angle A, as shown by curve 66. Curve 66 exhibits a non-Lambertian characteristic. By providing diffuser 56 with an array of lenses that produce an intensity-versus-angle characteristic of the type shown by curve 66, off-axis light measurement by light sensor 26 can be enhanced, thereby enhancing the ability of sensor 26 to respond accurately to changes in ambient lighting in the operating environment for device 10.

Figure 5:
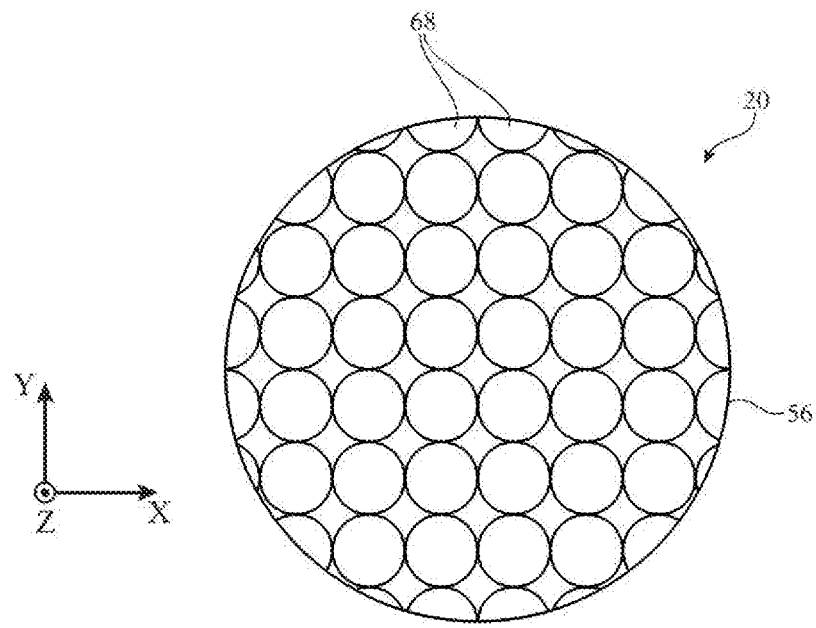
FIG. 5 is a top view of an illustrative diffuser formed from an array of equally sized and regularly spaced lenses in accordance with an embodiment.
Figure 6:
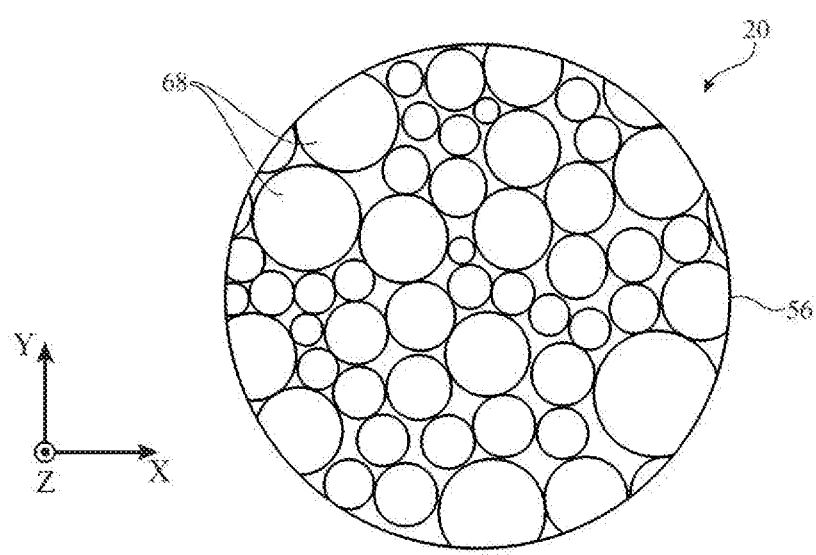
FIG. 6 is a top view of an illustrative diffuser formed from lenses having different center locations and different sizes to form an irregular lens array in accordance with an embodiment.

FIG. 5 is a top view of an illustrative diffuser having microlenses. Diffuser 56 of FIG. 5 has a circular outline (footprint when viewed from above along axis Z). Other shapes may be used for diffuser 56 if desired (e.g., rectangular outlines, triangular outlines, etc.). Lenses 68 of FIG. 5 have the same shape and size and extend in regular rows and columns to form an array of lenses across the surface of diffuser 56 (e.g., lenses 68 form a regular array). Other lens patterns may be used, if desired. As shown in FIG. 6, for example, diffuser 56 may include a collection of lenses 68 of various different diameters. The centers of these lenses need not be located in regular rows and columns, but rather may be distributed in an irregular pattern of locations across the surface of diffuser 56. Using random patterns for the locations and/or using random shapes, random sizes, random focal lengths, and/or other random lens attributes when forming lenses 68 in diffuser 56 (e.g., forming an irregular lens array) may help avoid undesired hotspots in diffused light 52'. Lenses 68 may be circular, may have truncated circular shapes (e.g., circles fit into rectangular or hexagonal outlines), and/or may have other suitable shapes.

Lenses 68 may be concave lenses and/or convex lenses. The diameter of diffuser 56 or other lateral dimension of diffuser 56 such as the length and/or width of diffuser 56 in the XY plane may be at least 100 microns, at least 200 microns, at least 400 microns, at least 600 microns, at least 1.5 mm, at least 2 mm, less than 1 mm, less than 600 microns, less than 400 microns, or other suitable size. Lenses 68 may have focal lengths of at least 2 microns, at least 5 microns, at least 20 microns, at least 50 microns, less than 300 microns, or other suitable focal lengths. The diameters of lenses 68 may be at least 1 micron, at least 2 microns, at least 5 microns, at least 10 microns, at least 20 microns, less than 300 microns, less than 50 microns, less than 25 microns, less than 20 microns, or other suitable diameter. Lenses 68 with diameters larger than visible and infrared wavelengths of interest retain desired refractive qualities (e.g., such lenses refract light more than diffracting light). Lenses of this size are also sufficiently small to allow multiple lenses to fit within the area consumed by diffuser 56, thereby helping to avoid hotspots in the diffused light being supplied at the output of diffuser 56. The distance separating diffuser 56 from sensor 26 may be, for example, 5-20 times the diameter of lenses 68.

Figure 7:
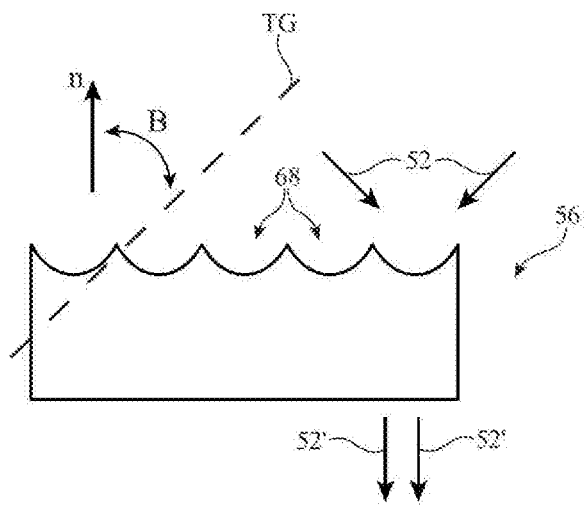
FIG. 7 is a cross-sectional side view of an illustrative diffuser having outwardly facing concave lenses in accordance with an embodiment.

A cross-sectional side view of an illustrative diffuser is shown in FIG. 7. In the example of FIG. 7, diffuser 56 has an array of concave lenses 56 (e.g., negative lenses). Each lens 56 may have a surface that is characterized by portions that reach a relatively large angle B with respect to surface normal n. For example, line TG, which is tangential to a steep portion of the surface of lens 68, may be characterized by an angle B of at least 40°, at least 50°, less than 70°, less than 60°, or other suitable value.

Figure 8:
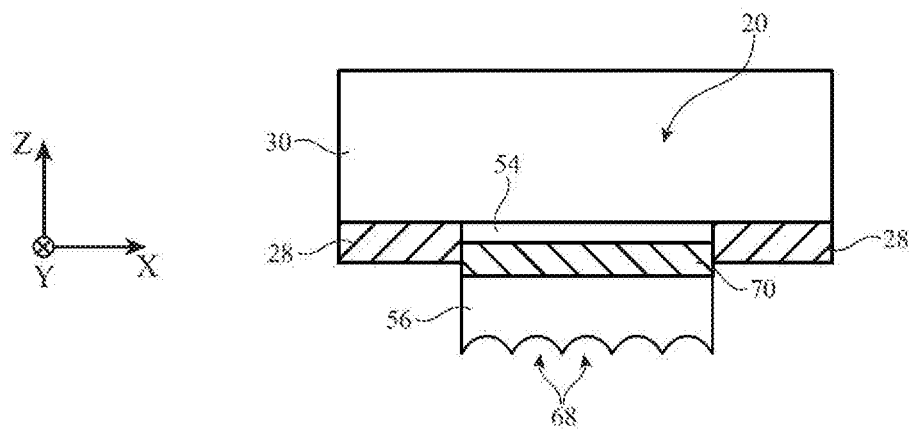
FIG. 8 is a cross-sectional side view of an illustrative diffuser having inwardly facing concave lenses in accordance with an embodiment.

As shown in FIG. 8, diffuser 56 may be mounted in device 10 on an inner surface of layer 54 in window region 20. In the illustrative arrangement of FIG. 8, diffuser 56 has a first side (e.g., a first surface) with concave inwardly facing lenses 68 and an opposing second side (surface) such as a planar surface that is attached to layer 54 using adhesive layer 70. Adhesive layer 70 may be, for example, a layer of optically clear adhesive that is transparent to light 50.

Figure 9:
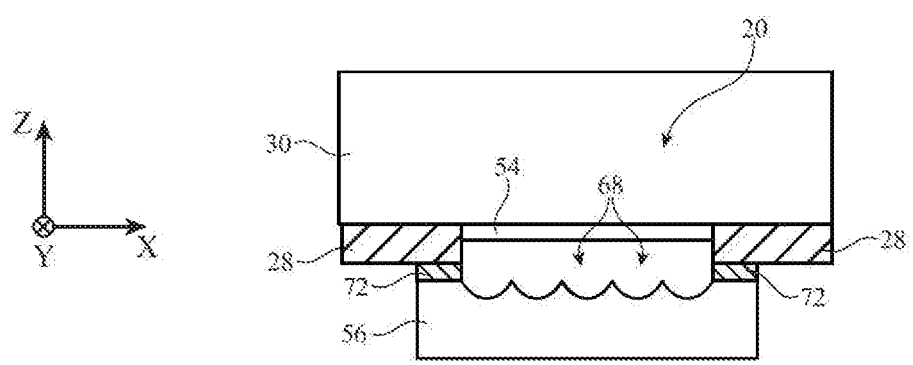
FIG. 9 is a cross-sectional side view of an illustrative diffuser having inwardly facing convex lenses in accordance with an embodiment.
Figure 10:
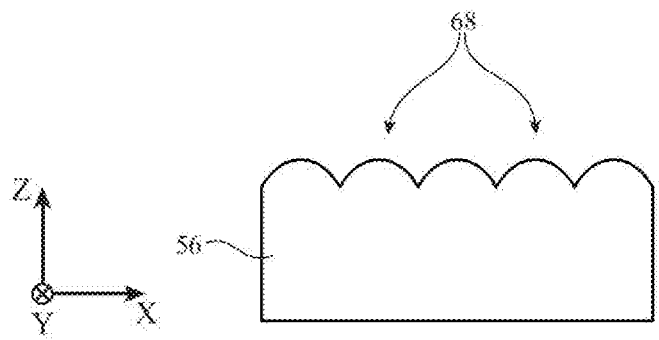
FIG. 10 is a cross-sectional side view of an illustrative diffuser having outwardly facing convex lenses in accordance with an embodiment.
Figure 11:
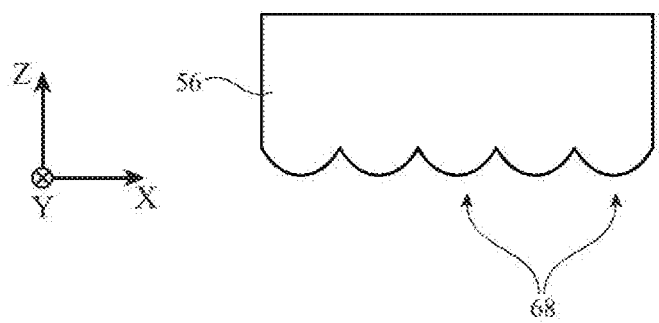
FIG. 11 is a cross-sectional side view of an illustrative diffuser having inwardly facing convex lenses in accordance with an embodiment.

In the illustrative arrangement of FIG. 9, diffuser 56 has been mounted in an orientation in which concave lenses 68 face outwardly towards display cover layer 30. Adhesive ring 72 may be used to attach diffuser 56 to display 14 (e.g., to layer 28).

Figure 12:
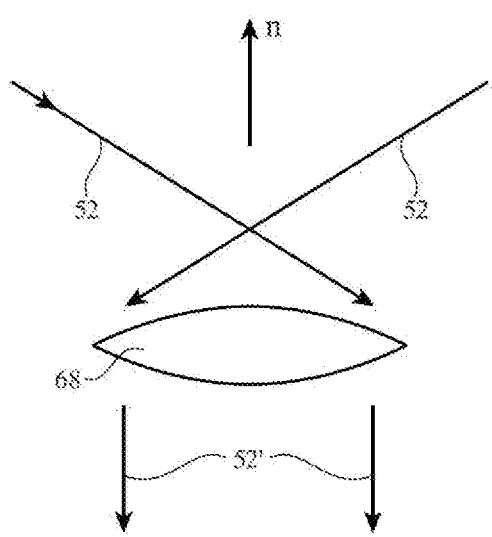
FIG. 12 is a cross-sectional side view of an illustrative positive lens for a light diffuser in accordance with an embodiment.

If desired, lenses 68 may include convex lenses (e.g., positive lenses). Convex lenses 68 may be mounted in an outwardly facing configuration (see, e.g., FIG. 10) or an inwardly facing configuration (see, e.g., FIG. 11). As shown in FIG. 12, convex lenses can help collimate off-axis light 52 to form light 52' at the output of diffuser 56. If desired, diffuser 56 may include both concave and convex lenses 68 and/or may include lenses 68 on both sides of diffuser 56. The configurations of FIGS. 8, 9, 10, and 11 are illustrative.

Figure 13:
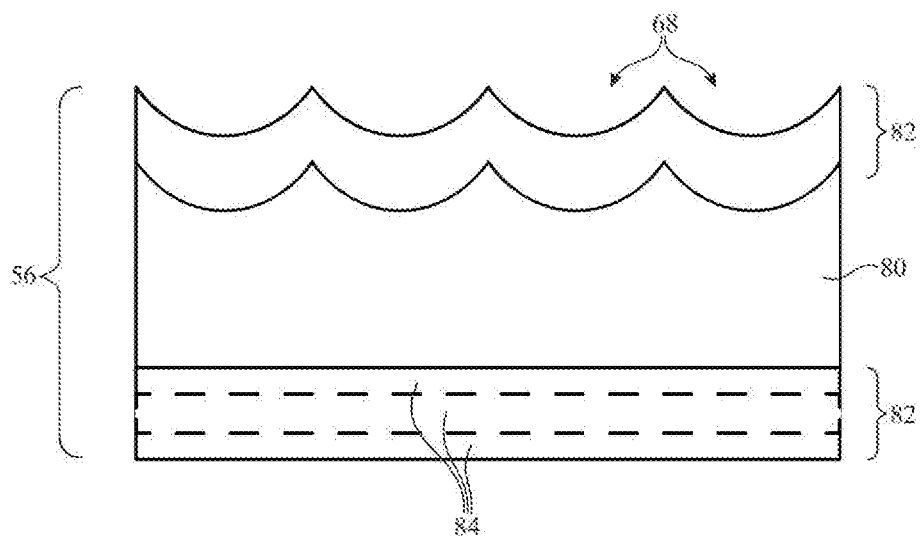
FIG. 13 is a cross-sectional side view of an illustrative diffuser with one or more coatings in accordance with an embodiment.

FIG. 13 shows how diffuser 56 may have one or more coating layers such as coatings 82. Coatings 82 may be formed on the upper and/or lower surfaces of diffuser portion 80 and may cover the curved surfaces of lenses 68 and/or a planar substrate surface or other surface associated with portion 80. Portion 80 may be formed from one or more layers. Coatings 82 may form antireflection coatings (e.g., a coating that reduces light reflection at a surface of diffuser 56 to less than 2%, less than 1%, less than 0.5% or other suitable amount, an infrared-blocking filter or other filter exhibiting a wavelength-dependent light transmission characteristic, and/or other coatings). Coatings 82 may each be formed from a single layer of material (e.g., a polymer, an inorganic material such as silicon oxide, etc.) and/or may be formed using multiple layers 84. Layers 84 may be, for example, stacked thin-film dielectric layers (e.g., at least 2 layers, at least 3 layers, at least 10 layers, fewer than 100 layers, etc.) of alternating refractive index that form a thin-film interference filter (e.g., a thin-film interference filter antireflection coating, a wavelength-dependent thin-film interference filter for blocking infrared light while transmitting visible light or other wavelength-dependent filter, etc.). Layers 84 may be formed from inorganic and/or organic materials.

To help reduce noise in sensor 26, it may be desirable to prevent infrared ambient light from reaching sensor 26. As an example, an infrared-light-blocking-and-visible-light-transmitting filter may overlap sensor 26 to help block infrared light while allowing visible ambient light to be received and measured by sensor 26. In an arrangement of the type shown in FIG. 3, for example, the filter may be interposed between cover layer 30 (layer 54) and sensor 26 (e.g., between diffuser 56 and sensor 26 as illustrated by infrared-light-blocking-and-visible-light-blocking filter 59). With one illustrative configuration, the transmission T of the infrared-light-blocking-and-visible-light-transmitting filter has a light transmission at visible wavelengths VIS such as 500 nm that is at least 10 times greater than its light transmission at infrared wavelengths IR such as 850 nm.

Figure 14:
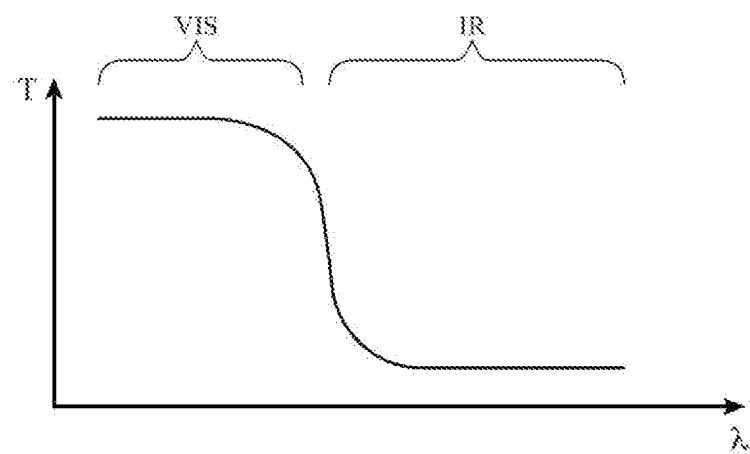
FIG. 14 is a graph of optical transmittance versus wavelength for an illustrative diffuser structure such as a substrate in accordance with an embodiment.

An infrared-light-blocking-and-visible-light transmitting filter may be formed using a stack of dielectric layers such as layers 84 in a coating 82 that form a thin-film interference filter that passes visible light and blocks infrared light (see, e.g., FIG. 14) and/or may be formed by a substrate (e.g., a glass or polymer substrate) or other layer between cover layer 30 and sensor 26 whose bulk optical properties exhibit high visible light transmission and low infrared light transmission.

If desired, an infrared-light-blocking-and-visible-light transmitting layer(s) such as a substrate layer may be formed from an infrared-light-blocking (absorbing) material such as blue glass or other infrared-light-blocking glass. The blue glass may be, for example, blue borosilicate glass such as borosilicate glass with copper oxide particles (as an example). This infrared-light-absorbing material may be used as a stand-alone filter and/or may be incorporated into other layer(s) overlapped by window 20. For example, infrared-light-blocking material such as blue glass may be used in forming a substrate layer in diffuser 56.

Figure 15:
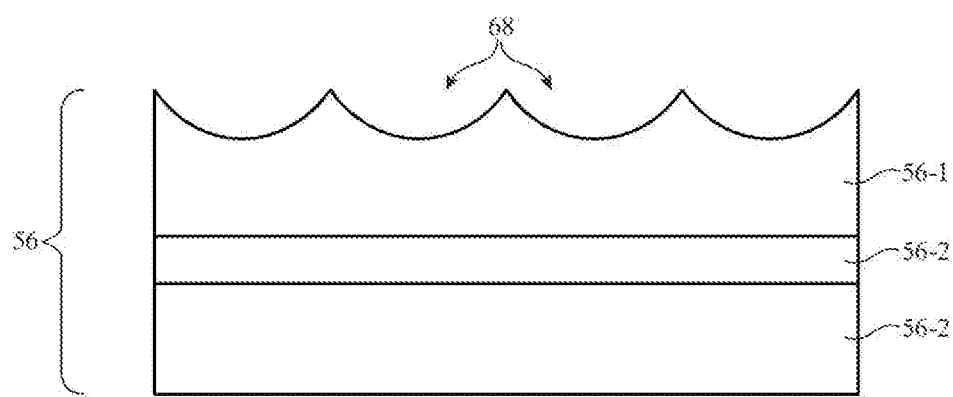
FIG. 15 is a cross-sectional side view of an illustrative diffuser having a lens array layer on a substrate and having an interposed buffer layer in accordance with an embodiment.

FIG. 15 is a cross-sectional side view of diffuser 56 in an illustrative configuration in which diffuser 56 includes a substrate layer. As shown in FIG. 15, diffuser 56 may include multiple layers such as substrate layer 56-3, buffer layer 56-2, and lens coating layer 56-1. Lens coating layer 56-1 may be formed from a polymer such as ultraviolet-light-cured epoxy or other ultraviolet-light-cured polymer (ultraviolet-light-curable polymer). The thickness of layer 56-1 may be at least 5 microns, at least 20 microns, at least 50 microns, less than 200 microns, less than 40 microns, or other suitable thickness. Substrate layer 56-3 may be formed from blue glass or other material (e.g., other material that blocks infrared light and transmits visible light). The thickness of substrate 56-3 may be at least 50 microns, at least 150 microns, at least 400 microns, at least 600 microns, at least 1 mm, less than 900 microns, less than 450 microns, less than 200 microns, less than 100 microns, or other suitable thickness.

Optional buffer layer 56-2 may be interposed between layers 56-1 and 56-3. Buffer layer 56-2 may be formed from a soft polymer that helps prevent delamination of lens coating layer (lens layer) 56-1 from substrate 56-3. Buffer layer 56-2 and layer 56-1 may be formed from different materials (e.g., different polymers). The thickness of layer 56-2 may be at least 3 microns, at least 10 microns, at least 50 microns, less than 40 microns, less than 20 microns, or other suitable thickness.

With one illustrative manufacturing process, substrate 56-3 may be a wafer (e.g., an 8 inch wafer) with sufficient surface area for forming multiple diffusers 56 in parallel. After depositing buffer layer 56-2, layer 56-1 may be deposited (e.g., as an uncured liquid polymer layer). After depositing layers 56-2 and 56-1, layer 56-1 may be patterned by pressing against layer 56-1 with a mold containing a three-dimensional lens pattern with a shape that is opposite to the desired shape for lenses 68 (e.g., a negative image of lenses 68 such as a pattern with convex lens bumps when it is desired to from an array of concave lenses 68). The stamp may be formed from an ultraviolet-light-transparent material (e.g., sapphire or fused silica) so that ultraviolet light may be transmitted through the stamp while the stamp is pressing against layer 56-1. Layer 56-1 may be formed from an ultraviolet-light-curable polymer layer such as a layer of ultraviolet-light-curable epoxy. After exposure to ultraviolet light through the stamp, layer 56-1 cures and solidifies. Once layer 56-1 is in a hardened state, the stamp can be removed, leaving a desired pattern of lenses 68 in layer 56-1. Other techniques may be used in forming an array of lenses 68 in diffuser 56, if desired (e.g., a step-and-repeat stamp process in which a small stamp is used to pattern layer 56-1 on a larger wafer of substrate 56-3), etching, machining, etc. If desired, lenses 68 may be formed directly in substrate layer 56-3 (e.g., by etching, molding, machining, etc.). In this type of configuration, buffer layer 56-2 may be omitted.

If desired, a hybrid diffuser arrangement may be used for forming diffuser 56. In this type of arrangement, light-scattering particles (e.g., high-refractive-index beads) may be embedded in buffer layer 56-2 or other polymer layer in diffuser 56 (e.g., a coating layer) in addition to forming an array of lenses 68 (e.g., in layer 56-1). With this approach, the presence of the embedded light-scattering particles in diffuser 56 (e.g., in buffer layer 56-2) may help diffuse ambient light 52 over a wide range of wavelengths (e.g., avoiding any wavelength dependencies in the optical properties of lenses 56) and may help diffuse ambient light 52 that is oriented at extremely off-axis angles.

| Table of Reference Numerals | | | |
|---|---|---|---|
| 10 | Electronic Device | 12 | Input-Output Device |
| 16 | Control Circuitry | 18 | Sensors |
| 20 | Window | 22 | Housing |
| 24 | Line | 25 | Direction |
| 26 | Light Sensor | 28 | Layer |
| 30 | Layer | 32 | Inner Surface |
| 34 | Surface | 52 | Ambient Light |
| 52' | Light | 54 | Layer |
| 56 | Diffuser | 56-1 | Coating Layer |
| 56-2 | Buffer Layer | 56-3 | Substrate |
| 58 | Filters | 59 | Filter |
| 60 | Detectors | 62 | Substrate |
| 68 | Lenses | 70 | Adhesive Layer |
| 72 | Adhesive ring | 80 | Portion |
| 82 | Coatings | 84 | Layers |

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a display having pixels that displays images;
   a display cover layer that overlaps the pixels;
   a light diffuser having a substrate layer and a lens layer on the substrate layer, wherein the light diffuser is coupled to the display cover layer;
   a coating layer on a curved surface of the lens layer;
   an ambient light sensor configured to measure ambient light passing through the light diffuser; and
   control circuitry configured to adjust the display using the measured ambient light.

2. The electronic device defined in claim 1, wherein the ambient light sensor is configured to measure the ambient light through the display cover layer.

3. The electronic device defined in claim 2 wherein the lens layer has concave lenses.

4. The electronic device defined in claim 3 wherein the diffuser has a first side facing the display cover layer and a second side facing away from the display cover layer and wherein the concave lenses are formed on the first side.

5. The electronic device defined in claim 3 wherein the diffuser has a first side facing the display cover layer and a second side facing away from the display cover layer and wherein the concave lenses are formed on the second side.

6. The electronic device defined in claim 2 wherein the lens layer has convex lenses.

7. The electronic device defined in claim 6 wherein the diffuser has a first side facing the display cover layer and a second side facing away from the display cover layer and wherein the convex lenses are formed on the first side.

8. The electronic device defined in claim 6 wherein the diffuser has a first side facing the display cover layer and a second side facing away from the display cover layer and wherein the convex lenses are formed on the second side.

9. The electronic device defined in claim 1 wherein the lens layer comprises ultraviolet-curable polymer.

10. The electronic device defined in claim 1 wherein the diffuser comprises a polymer buffer layer between the lens layer and the substrate layer.

11. The electronic device defined in claim 10 further comprising light-scattering particles embedded in the polymer buffer layer.

12. The electronic device defined in claim 1 wherein the substrate layer comprises an infrared-light-blocking-and-visible-light transmitting layer.

13. The electronic device defined in claim 1 wherein the substrate layer comprises blue glass.

14. An electronic device, comprising:
   an ambient light sensor diffuser, comprising:
      a substrate layer;
      a buffer layer on the substrate layer; and
      a polymer lens layer on the buffer layer, wherein the buffer layer prevents delamination of the polymer lens layer from the substrate layer and wherein the buffer layer is interposed between the substrate layer and the polymer lens layer; and
   an ambient light sensor that receives light that has passed through the ambient light sensor diffuser.

15. The electronic device defined in claim 14 wherein the polymer lens layer has an array of lenses and wherein each lens has a diameter of 2-25 microns, the electronic device further comprising:
   a display having pixels that displays images; and
   control circuitry configured to adjust the display based on a measurement from the ambient light sensor.

16. The electronic device defined in claim 15 wherein the lenses are concave lenses.

17. The electronic device defined in claim 15 wherein the lenses are convex lenses.

18. The electronic device defined in claim 15 wherein the lenses are arranged in an irregular pattern, wherein the buffer layer is formed from a first polymer, and wherein the polymer lens layer is formed from a second polymer that is different than the first polymer.

19. An electronic device, comprising:
- a display;
- a diffuser having a substrate and a continuous cured polymer layer with lenses; and
- an ambient light sensor configured to measure ambient light that has been passed through the diffuser; and
- control circuitry configured to adjust the display using the measured ambient light.

20. The electronic device defined in claim 19 further comprising a polymer buffer layer interposed between the cured polymer layer and the substrate, wherein the substrate comprises a glass layer, wherein the cured polymer layer comprises a first polymer, and wherein the polymer buffer layer comprises a second polymer that is different than the first polymer.

\* \* \* \* \*